United States Patent
Waldfried et al.

(10) Patent No.: US 7,629,272 B2
(45) Date of Patent: Dec. 8, 2009

(54) ULTRAVIOLET ASSISTED POROGEN REMOVAL AND/OR CURING PROCESSES FOR FORMING POROUS LOW K DIELECTRICS

(75) Inventors: Carlo Waldfried, Falls Church, VA (US); Qingyuan Han, Columbia, MD (US); Orlando Escorcia, Falls Church, VA (US); Ivan Berry, III, Ellicott City, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 406 days.

(21) Appl. No.: 11/146,742

(22) Filed: Jun. 7, 2005

(65) Prior Publication Data

US 2006/0024976 A1 Feb. 2, 2006

Related U.S. Application Data

(60) Provisional application No. 60/577,726, filed on Jun. 7, 2004.

(51) Int. Cl.
*H01L 21/31* (2006.01)

(52) U.S. Cl. .................. 438/781; 438/778; 438/780; 438/783; 257/E21.273; 257/E21.581

(58) Field of Classification Search .............. 438/778, 438/780, 781, 783
See application file for complete search history.

(56) References Cited

U.S. PATENT DOCUMENTS

| | | | |
|---|---|---|---|
| 6,121,130 A | 9/2000 | Chua et al. | 438/623 |
| 6,475,930 B1 | 11/2002 | Junker et al. | 438/787 |
| 6,596,467 B2 | 7/2003 | Gallagher et al. | 430/314 |
| 6,667,147 B2 | 12/2003 | Gallagher et al. | 430/311 |
| 6,703,324 B2 | 3/2004 | Wong | 438/787 |
| 6,737,117 B2 | 5/2004 | Boisvert et al. | 427/377 |
| 2003/0054115 A1 | 3/2003 | Albano et al. | 427/487 |
| 2003/0157267 A1 | 8/2003 | Waldfried et al. | 427/488 |

(Continued)

OTHER PUBLICATIONS

Jeffrey M. Calvert et al., A New Approach to Ultralow-K Dielectrics, Semiconductor International, Nov. 2003, pp. 56-60.

(Continued)

*Primary Examiner*—Alexander G Ghyka
(74) *Attorney, Agent, or Firm*—Cantor Colburn LLP (57) ABSTRACT

Processes for forming porous low k dielectric materials from low k dielectric films containing a porogen material include exposing the low k dielectric film to ultraviolet radiation. In one embodiment, the film is exposed to broadband ultraviolet radiation of less than 240 nm for a period of time and intensity effective to remove the porogen material. In other embodiments, the low k dielectric film is exposed to a first ultraviolet radiation pattern effective to increase a crosslinking density of the film matrix while maintaining a concentration of the porogen material substantially the same before and after exposure to the first ultraviolet radiation pattern. The low k dielectric film can be then be processed to form a metal interconnect structure therein and subsequently exposed to a second ultraviolet radiation pattern effective to remove the porogen material from the low k dielectrics film and form a porous low k dielectric film.

16 Claims, 3 Drawing Sheets

U.S. PATENT DOCUMENTS

| | | | |
|---|---|---|---|
| 2004/0018319 A1 | 1/2004 | Waldfried et al. | 427/508 |
| 2004/0058090 A1 | 3/2004 | Waldfried et al. | 427/558 |
| 2004/0096593 A1 | 5/2004 | Lukas et al. | 427/558 |
| 2004/0096672 A1 | 5/2004 | Lukas et al. | 428/446 |
| 2004/0102032 A1 | 5/2004 | Kloster et al. | 438/623 |
| 2004/0137241 A1* | 7/2004 | Lin et al. | 428/447 |

OTHER PUBLICATIONS

James L. Hedrick et al., Templating Nanoporosity in Thin-Film Dielectric Insulators, Advanced Materials 1998, 10, No. 13, pp. 1049-1053.

* cited by examiner

ULTRAVIOLET ASSISTED POROGEN REMOVAL AND/OR CURING PROCESSES FOR FORMING POROUS LOW K DIELECTRICS

CROSS REFERENCE TO RELATED APPLICATIONS

The present application relates to and claims priority to U.S. Provisional Application No. 60/577,726 filed on Jun. 7, 2004, incorporated herein by reference in its entirety.

BACKGROUND

The present disclosure generally relates to the manufacture of semiconductor devices, and more particularly, to ultraviolet assisted porogen removal and/or curing processes for forming porous low k dielectric materials employed in semiconductor devices.

As semiconductor and other microelectronic devices progressively decrease in size, the demands placed on device components continue to increase. For example, the prevention of capacitive crosstalk between interconnect lines becomes significantly more important with smaller devices. Capacitive crosstalk is generally a function of both the distance between conductors and the dielectric constant (k) of the material (i.e., the insulator) placed in between the conductors. Considerable attention has been focused on electrically isolating the conductors from each other using new insulators having low dielectric constants because although silica ($SiO_2$), which has traditionally been used in such devices because of its relatively low dielectric constant of about 4 and met the requirements of earlier (i.e., larger) applications, it will not be adequate as devices scale down.

To achieve low dielectric constants, one can either use a material that inherently possesses a low dielectric constant, and/or introduce porosity into the material, which effectively lowers the dielectric constant because the dielectric constant of air is nominally 1. Porosity has been introduced in low k materials through a variety of means. A lowering of the k value can be achieved by using high boiling point solvents, by using templates, or by using porogen-based methods. However, the integration of porous low-k materials in the manufacture of the semiconductor device, in general, has proven difficult.

One major issue with porogen-based low k dielectrics lies in the difficulty with removing the porogen without leaving residual porogen fragments and without adversely affecting the rest of the dielectric material or other components in the semiconductor device. The vast majority of methods requires a thermal cure step at temperatures of 300° C. or higher and for durations of 30 minutes or longer to cross-link the film, decompose and/or remove volatile porogen components, and reduce the dielectric constant of the film. These thermal processes may exceed the allowable thermal budgets for device manufacture. Moreover, the introduction of pores into the dielectric material in this manner can reduce the overall mechanical strength, cohesive strength and fracture toughness of the porous dielectric material. In addition to affecting the thermal and mechanical properties, the so-cured porous dielectric materials may have relatively poor moisture resistance and wet etching resistance, an area of concern where improvement is generally desired.

Consequently, other cure techniques and process flows have been developed in an attempt to address these integration issues. For example, processes for forming porous low k dielectrics from porogen based materials have included ultraviolet (UV) or vacuum ultraviolet (VUV) light in combination with an oxygen-containing atmosphere as an alternative to thermal cure processes to create pores within the dielectric material. However, these techniques may degrade or even destroy the resultant film by chemically modifying the non-porogen component of the dielectric material.

Another major issue facing the integration of porous low-k material technology is how to enable pore creation while affording a structure that can withstand other processing steps, such as chemical-mechanical polishing (CMP), wire bonding, dicing, plasma etching, wet processing, diffusion barrier layer deposition, interconnect line deposition, plasma ashing, and chemical and thermal treatments, among others. During subsequent processing, penetration of reactant chemicals and solvents into the pores, contact with abrasives, and the like, can degrade the dielectric film, increase the dielectric constant, and/or leave residues that can further deleteriously affect subsequent manufacturing steps. Many prior art methods attempt to overcome this issue by capping the porous dielectric film layer with one or more thin non-porous dielectric films during device manufacture, which may protect the surface of the porous film layer against damage from a subsequent process such as CMP as well as enhance the lithographic process by providing reflection control and/or added etching selectivity. However, the harsh chemical steps that follow CMP may still degrade the dielectric material or increase the dielectric constant if reactive gases and/or solvents penetrate into the porous film. Moreover, the addition of a capping layer increases the complexity of the device, increases effective k-value, adds an additional process step, increases manufacturing costs, and the like, which are generally undesirable as devices scale to smaller feature sizes.

As such, a successful low-k candidate must display several critical material properties such as, for example, chemical resistance to oxidation and moisture absorption after plasma ashing, stripping and cleaning, and CMP processes; thermal stability (no weight loss or shrinkage following repeated isothermal soaks at, for example, 400° C.); and the ability to adhere to substrates, including liners and barriers, in order to withstand the shearing and delamination forces exerted by the CMP process.

There remains a need in the art to provide improved methods in the manufacture of porogen-based low k dielectric materials for integration into semiconductor devices. Because of at least the problems noted in the prior art, it would be desirable if the methods did not chemically modify the film so as to affect the physical and mechanical properties of the dielectric layer or other device components during porogen removal. It would be more desirable if the methods were more favorable with respect to thermal budget concerns. It also would be advantageous if the methods reduced the integration issues associated with the low k dielectric materials, e.g., eliminates the need for capping layers and the like.

BRIEF SUMMARY

Disclosed herein are processes for ultraviolet assisted porogen removal and/or curing processes for forming porous low k dielectric materials and electrical interconnect structures in semiconductor devices. In one embodiment, a process for forming an electrical interconnect structure comprises depositing a non-porous dielectric material onto a substrate, wherein the non-porous dielectric material comprises a matrix and a porogen material; patterning the non-porous dielectric material and forming a metal interconnect structure; and exposing the non-porous low k dielectric material to an ultraviolet radiation pattern for a period of time effective to remove a portion of the porogen material, wherein the removed portion forms pores within the matrix and forms a porous dielectric material, wherein the ultraviolet radiation pattern comprises broadband wavelengths less than 240 nanometers.

In another embodiment, a process for forming a porous low k dielectric material consists essentially of exposing a non-porous dielectric layer comprising a porogen material and a matrix to ultraviolet radiation having a broadband radiation pattern comprising wavelengths less than 240 nanometers for a period of time and at an intensity effective to volatilize the porogen material from the matrix; and flowing a gas about the non-porous dielectric layer to remove the volatilized porogen material and form the porous low k dielectric material.

In yet another embodiment, the process for forming an electrical interconnect structure comprises depositing a non-porous dielectric material comprising a matrix and a porogen material onto a substrate; exposing the non-porous dielectric film to a first ultraviolet radiation pattern, wherein the first ultraviolet radiation pattern is effective to increase the crosslinking density of the non-porous dielectric film, and wherein a concentration of the porogen material remains substantially the same before and after exposure to the first ultraviolet radiation pattern; patterning the non-porous dielectric material and forming a metal interconnect structure in the patterned non-porous dielectric material; and exposing the non-porous dielectric material to a second ultraviolet radiation pattern in an amount to effectively remove porogen material from the matrix and form a porous low k dielectric material.

The above described and other features are exemplified by the following figures and detailed description.

BRIEF DESCRIPTION OF THE DRAWINGS

Referring now to the figures, which are exemplary embodiments and wherein like elements are numbered alike.

DETAILED DESCRIPTION

The present disclosure is generally directed to a process for forming an electrical interconnect structure using a porogen based low k dielectric film to produce a porous low k dielectric layer therein. The process includes an ultraviolet (UV) curing process for removing porogen materials from the low k dielectric film to form porous low k dielectric films. The UV curing process for forming the porous low k dielectric film as will be described in greater detail below occurs after deposition of the layers employed in the interconnect structure and provides a means for integrating porous low k dielectric materials within the integrated circuit manufacturing process. As used herein, the term "porous low k dielectric materials" generally refers to those materials comprising a matrix and a removable porogen, wherein the porous dielectric material after removal of the porogen by the UV process, has a dielectric constant (k) less than 3.0.

The process for forming electrical interconnect structures generally comprises depositing or coating a layer of the low k dielectric material containing the porogen onto a substrate. In one embodiment, the layer is exposed to a first ultraviolet radiation pattern for a time and intensity effective to primarily increase the crosslinking density without removing any substantial amount of porogen material. The amount of porogen material that is removed is an amount such that the pore fill ratio remains substantially unaffected, e.g. within +/−20% of the pore fill ratio before processing. The layer is then patterned using conventional lithographic techniques including a hard mask, if desired, in the process flow. The patterned low k dielectric material is then coated with a barrier/copper seed layer generally employed for subsequent deposition of a copper interconnect structure in the vias/trenches provided by the patterned low k dielectric layer. The substrate is then typically subjected to a chemical mechanical polish process for planarizing the patterned copper surface. By maintaining the low k dielectric layer as substantially non-porous, the chemical mechanical polishing process to effect planarization does not deleteriously affect integration. For example, etching selectivity is maintained since minimal pores are present at this step in the process of forming the interconnect structure. Likewise, the harsh chemical steps that follow CMP will not degrade the dielectric material or increase the dielectric constant since reactive gases and/or solvents cannot penetrate into the non-porous dielectric film.

It is after these process steps leading to the formation of the interconnect structure (e.g., low k dielectric and copper integrated structure) that the device is then exposed to a second ultraviolet radiation pattern, which is at intensity and time effective to remove substantially all of the removable porogen material from the low k dielectric layer, thereby creating a porous low k dielectric layer. The resulting dielectric constant for the porous low k material advantageously decreases as a result of exposing the low k dielectric material to the second ultraviolet radiation pattern.

Unexpectedly, it has been found that the exposure to the first and second ultraviolet radiation patterns as described herein is effective for crosslinking the low k dielectric film prior to patterning of the low k dielectric layer and copper metallization (first UV radiation exposure) and for efficiently removing the removable porogen material without degrading the porous low k dielectric structure after formation of the metal interconnect structure (second UV radiation exposure). In this manner, the problems noted in the prior art can be eliminated. For example, since cross linking of the dielectric material occurs prior to patterning and the pores are not substantially formed until after completion of subsequent metallization process steps, penetration of reactant chemicals and solvents into the pores, contact with abrasives during chemical mechanical polishing, and/or the like, does not occur. Moreover, compared to a conventional thermal cure process to remove the porogen material, exposure to the ultraviolet radiation pattern does not affect the thermal budget and is generally more efficient. For example, greater amounts of porogen material can be removed from the low k dielectric material upon exposure to the second ultraviolet radiation pattern as compared to the amount of porogen removed after a thermal porogen removal process such as by furnace cure. In addition to providing greater efficiency with the UV curing process, the process times are markedly reduced relative to conventional furnace cure processes.

In another embodiment, a UV curing process comprises exposing the low k dielectric film to a broadband ultraviolet radiation pattern of 170 to 240 nanometers (nm) to effectively remove porogen material from the low k dielectric material. It has unexpectedly been found that this particular wavelength region is more effective than ultraviolet radiation at wavelengths greater than 240 nm. As used herein, the term broadband refers to a wavelength having a FWHM greater than about 10 nanometers. The UV curing process can be practiced before or after dielectric patterning as may be desired from some applications and dielectric materials. As such, an exemplary process for forming the electrical interconnect structure may comprise depositing the low k dielectric film, forming a pattern in the low k dielectric film, forming the metal interconnects, and exposing the substrate to a broadband ultraviolet radiation pattern having wavelengths of 180 nm to 240 nm. In this manner, the low k dielectric film is made porous after the formation of the metal interconnect structure.

In still another embodiment, porogen removal and crosslinking may be performed simultaneously. The UV radiation pattern is selected to provide both porogen removal and increase the crosslinking density of the low k dielectric material. In one embodiment, the UV exposure suitable for porogen removal and crosslinking occurs after formation of the interconnect structure in the manner previously described As used herein, the term "porous low k dielectric" generally refers to materials deposited or coated comprising an ultraviolet radiation removable porogen material and a matrix or a matrix precursor. The methods for deposition and/or coating are well known in the art and are not intended to be limited. Some examples of processes that may be used to form the initial low k dielectric film include chemical vapor deposition (CVD), plasma enhanced chemical vapor deposition (PECVD), high density PECVD, photon assisted CVD, plasma-photon assisted CVD, cryogenic CVD, chemical assisted vapor deposition, hot-filament CVD, CVD of a liquid polymer precursor, deposition from supercritical fluids, or transport polymerization ("TP"). Other processes that can be used to form the film include spin coating, dip coating, Langmuir-blodgett self-assembly, or misting deposition methods.

As used herein, the term "porogen material" generally refers to those sacrificial organic based materials known in the art that generate or form pores within the low k dielectric film after removal thereof. The porogen materials form domains (or discrete regions) in the matrix or matrix precursor, which upon removal from the matrix or matrix precursor form pores, i.e., voids. Preferably, the domains should be no larger than the final desired pore size. In the present disclosure, suitable porogen materials include materials that degrade upon exposure to ultraviolet radiation to form volatile fragments or radicals, which can be removed from the matrix material or matrix precursor material under a flow of inert gas and/or exposure to heat, for example. In this manner, upon exposure to the ultraviolet radiation, pores are formed within the matrix.

Those porogen materials that are generally characterized in the art as thermally labile, thermally removable, and the like, are generally suitable for removal upon exposure to the ultraviolet radiation processes described herein. Materials of this kind are generally described in U.S. Pat. No. 6,653,358, entitled, "A Composition Containing a Cross-linkable Matrix Precursor and a Porogen and a Porous Matrix Prepared Therefrom", the contents of which are incorporated herein in their entirety by reference.

Exemplary porogen materials susceptible to removal upon exposure to the ultraviolet radiation processes described herein generally include, but are not limited to, hydrocarbon materials, labile organic groups, solvents, decomposable polymers, surfactants, dendrimers, hyper-branched polymers, polyoxyalkylene compounds, or combinations thereof.

For example, the porogen material may be a block copolymer (e.g., a di-block polymer). Such materials may be capable of self-assembling if the blocks are immiscible to give separated domains in the nanometer size range. Such a block copolymer can be added to the cross-linkable matrix precursor with or without solvent to obtain a formulation suitable for processing. The block copolymer can self-assemble during processing (e.g., after spin coating, but before the matrix is formed). One or more of the blocks may be reactive with the matrix or the blocks may be non-reactive. One or more of the blocks may be compatible with the matrix, or its precursor, but preferably at least one block is incompatible with the matrix. Useful polymer blocks can include an oligomer of the matrix precursor, polyvinyl aromatics, such as polystyrenes, polyvinylpyridines, hydrogenated polyvinyl aromatics, polyacrylonitriles, polyalkylene oxides, such as polyethylene oxides and polypropylene oxides, polyethylenes, polylactic acids, polysiloxanes, polycaprolactones, polycaprolactams, polyurethanes, polymethacrylates, such as polymethylmethacrylate or polymethacrylic acid, polyacrylates, such as polymethylacrylate and polyacrylic acid, polydienes such as polybutadienes and polyisoprenes, polyvinyl chlorides, polyacetals, and amine-capped alkylene oxides.

For example, a diblock polymer based on polystyrene and polymethylmethacrylate can be added to a solution of CYCLOTENE® resin in a suitable solvent such as mesitylene at a weight:weight ratio of resin to diblock polymer of preferably not less than about 1:1, and more preferably not less than 2:1, and most preferably not less than 3:1. The overall solids content is application dependent, but is generally not less than about 1 weight percent, more generally not less than about 5 weight percent, and most generally not less than about 10 weight percent, and generally not greater than about 70, more generally not greater than about 50, and most generally not greater than 30 weight percent. The solution can then be spin-coated onto a suitable substrate leaving a thin film containing a dispersed phase of diblock copolymer in a continuous phase of DVS-bisBCB. The film can then be radiation cured leaving a crosslinked polymer system containing a dispersed phase of poly(styrene-b-methylmethacrylate) in a continuous phase of cross-linked DVS-bisBCB. For example, the film can be cured by exposure to a first UV radiation pattern that effectively crosslinks the film. The diblock copolymer can then be decomposed or removed by exposure to ultraviolet radiation to leave a porous cross-linked DVS-bisBCB polymer. Similarly, a diblock polymer based on polystyrene and polybutadiene can be added to a b-staged solution of a dicyclopentadienone (e.g., 3,3'-(oxydi-1,4-phenylene)bis(2,4,5-triphenycyclpentadienone)) and a trisacetylene (e.g., 1,3,5-tris(phenylethynyl)benzene).

Thermoplastic homopolymers and random (as opposed to block) copolymers may also be utilized as suitable porogen materials. As used herein, "homopolymer" means compounds comprising repeating units from a single monomer. Suitable thermoplastic materials include polystyrenes, polyacrylates, polymethacrylates, polybutadienes, polyisoprenes, polyphenylene oxides, polypropylene oxides, polyethylene oxides, poly(dimethylsiloxanes), polytetrahydrofurans, polyethylenes, polycyclohexylethylenes, polyethyloxazolines, polyvinylpyridines, polycaprolactones, polylactic acids, copolymers of these materials and mixtures of these materials. The thermoplastic materials may be linear, branched, hyperbranched, dendritic, or star like in nature.

Polystyrene can be suitable with thermosettable mixtures or b-staged products of a polycyclopentadienone and a polyacetylene. The polystyrene polymer can be made to actinically (ultraviolet radiation) decompose into primarily the monomer, which can then diffuse out of the matrix. Any known polystyrene may be useful as the porogen. For example, anionic polymerized polystyrene, syndiotactic polystyrene, unsubstituted and substituted polystyrenes (e.g., poly($\alpha$-methyl styrene)) may all be used as the porogen.

For example, anionically polymerized polystyrene with a number average molecular weight of 8,500 can be blended with a polyarylene b-staged reaction product of a polycyclopentadienone and a polyacetylene. This solution can then be spin-coated onto a suitable substrate to create a thin film containing the dispersed phase of polystyrene in the polyarylene matrix precursor. The coated wafer can first be cured (i.e., forms a crosslinked matrix containing the porogen material) thermally, e.g., on a hot plate, or by exposure to ultraviolet radiation and at a temperature less than 425° C., for example. The polystyrene porogen can then be removed by exposure to a suitable ultraviolet radiation pattern to form a porous polyarylene matrix. Removing the porogen material can occur before or after dielectric patterning depending on the desired application.

The porogen material may also be designed to react with the cross-linkable matrix precursor during or subsequent to b-staging to form blocks or pendant substitution of the polymer chain. Thus, thermoplastic polymers containing, for example, reactive groups such as vinyl, acrylate, methacrylate, allyl, vinyl ether, maleimido, styryl, acetylene, nitrile, furan, cyclopentadienone, perfluoroethylene, BCB, pyrone, propiolate, or ortho-diacetylene groups can form chemical bonds with the cross-linkable matrix precursor, and then the thermoplastic can be removed to leave pores. The thermoplastic polymer can be homopolymers or copolymers of polystyrenes, polyacryclates, polymethacrylates, polybutadienes, polyisoprenes, polyphenylene oxides, polypropylene oxides, polyethylene oxides, poly(dimethylsiloxanes), polytetrahydrofurans, polyethylenes, polycyclohexylethylenes, polyethyloxazolines, polycaprolactones, polylactic acids, and polyvinylpyridines or mixtures thereof. A single reactive group or multiple reactive groups may be present on the thermoplastic. The number and type of reactive group will determine whether the thermoplastic porogen is incorporated into the matrix as a pendant material or as a block. The thermoplastic materials may be linear, branched, hyperbranched, dendritic, or star-like in nature.

For example, a low molecular weight (<10,000 Mn) polypropylene glycol oligomer can be end-capped with cinnamate groups, then added at about 10 to about 30 weight percent to a neat DVS-bisBCB monomer. This mixture can then be b-staged by heating, then diluted with a suitable solvent such as mesitylene and spin-coated onto a suitable substrate to create a thin film containing a dispersed phase of polypropylene glycol oligomers chemically bonded to the b-staged DVS-bisBCB. The dispersed polypropylene glycol oligomers can then be decomposed by exposure to a suitable ultraviolet radiation pattern and process to leave a porous cross-linked DVS-bisBCB polymer.

The desired molecular weight of polymeric porogen will vary with a variety of factors, such as their compatibility with the matrix precursor and cured matrix, the desired pore size, an the like. Generally, however, the number average molecular weight of the porogen is greater than about 2,000 and less than about 100,000. The porogen polymer also preferably has a narrow molecular weight distribution.

The porogen may also be a material that has an average diameter of about 0.5 to about 50 nanometers (nm). Examples of such materials include dendrimers (polyamidoamine (PAMAM), dendrimers are available through Dendritech, Inc.; polypropylenimine polyamine (DAB-Am) dendrimers available from DSM Corporation; Frechet type polyethereal dendrimers; Percec type liquid crystal monodendrons, dendronized polymers and their self-assembled macromolecules, hyperbranched polymer systems such as Boltron H series dendritic polyesters (commercially available from Perstorp AB) and latex particles, especially cross-linked polystyrene containing latexes. These materials may be non-reactive with the cross-linkable matrix precursor, or reactive as described above. For example, a generation 2 PAMAM (polyamidoamine) dendrimer from Dendritech, Inc. can be functionalized with vinyl benzyl chloride to convert amine groups on the surface of the dendrimer to vinyl benzyl groups. This functionalized dendrimer can then be added to a solution of b-staged DVS-bisBCB in mesitylene, and the mixture can then be spin-coated on a suitable substrate to obtain a dispersed phase of PAMAM dendrimer in DVS-bisBCB oligomers. The film can be thermally cured to obtain a cross-linked polymer system (i.e., matrix) containing a dispersed phase of PAMAM dendrimer chemically bonded to a continuous phase of cross-linked DVS-bisBCB. The dendrimer can then be decomposed by exposure to ultraviolet radiation to obtain the porous cross-linked DVS-bisBCB polymer. Alternatively, a generation 4 Boltron dendritic polymer (H40) from Perstorp AB can be modified at its periphery with benzoyl chloride to convert hydroxy groups on the surface of the dendrimer to phenyl ester groups. This functionalized dendrimer can then be added to a precursor solution of partially polymerized (i.e., b-staged) reaction product of a polycyclopentadiene compound and a polyacetylene compound in a solvent mixture of gamma-butyrolactone and cyclohexanone. The mixture can then be spin-coated on a silicon wafer to obtain a dispersed phase of Boltron H40 benzoate dendritic polymers in precursor oligomers. The film can be thermally cured to obtain a cross-linked polymer system containing a dispersed phase of dendrimer chemically bonded to a continuous phase of cross-linked polyarylene. The dendrimer can then be decomposed by exposure to the ultraviolet radiation process to obtain the porous cross-linked polyarylene.

Alternatively, the porogen may also be a solvent. For example, a b-staged prepolymer or partially cross-linked polymer can first be swollen in the presence of a suitable solvent or a gas. The swollen material can then be further cross-linked to increase structural integrity, whereupon the solvent or gas is then removed by ultraviolet radiation. Suitable solvents include, but are not intended to be limited to, mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

The concentration of pores in the porous matrix is sufficiently high to lower the dielectric constant but sufficiently low to allow the matrix to withstand the process steps required in the manufacture of the desired microelectronic device (for example, an integrated circuit, a multichip module, or a flat panel display device). Preferably, the density of pores is sufficient to lower the dielectric constant to less than 3.0, more preferably to less than 2.5 and even more preferably, less than 2.0. Preferably, the concentration of the pores is at least 5 volume percent, more preferably at least 10 volume percent and most preferably at least 20 volume percent, and preferably not more than 70 volume percent, more preferably not more than 60 volume percent based on the total volume of the porous matrix.

The average diameter of the pores is preferably less than about 4 nm; and more preferably, less than 1 nm.

Suitable matrices and matrix precursors generally include, but are not intended to be limited to a silicon-containing polymer, or a precursor to such a polymer, e.g., methyl silsesquioxane, and hydrogen silsesquioxane; adamantine based thermosetting compositions; cross-linked polyphenylene; polyaryl ether; polystyrene; crosslinked polyarylene; polymethylmethacrylate; aromatic polycarbonate; aromatic polyimide; and the like.

Suitable silicon containing compounds generally include silicon, carbon, oxygen and hydrogen atoms, also commonly referred to as SICOH dielectrics. Exemplary silicon containing compounds include silsesquioxanes, alkoxy silanes, preferably partially condensed alkoxysilanes (e.g., partially condensed by controlled hydrolysis of tetraethoxysilane having an Mn of about 500 to 20,000), organically modified silicates having the composition $RSiO_3$ and $R_2SiO_2$ wherein R is an organic substituent, and orthosilicates, preferably partially condensed orthosilicates having the composition $Si(OR)_4$. As is known in the art, silsesquioxanes are polymeric silicate materials of the type $(RSiO1.5)n$, wherein R is an organic substituent. Combinations of two or more different silicon containing compounds may also be used.

Suitable silicon containing compounds are known to those skilled in the art, and/or are described in the pertinent texts, patents, and literature. See, for example, U.S. Pat. No. 5,384,376 to Tunney et al., U.S. Pat. No. 6,107,357 to Hawker et al., and U.S. Pat. No. 6,143,643 to Carter et al., and Chem. Rev. 95:1409-1430 (1995). Preferably, the silicon containing compounds are silsesquioxanes. Suitable silsesquioxanes include, but are not limited to, hydrogen silsesquioxanes, alkyl (preferably lower alkyl, e.g., methyl) silsesquioxanes, aryl (e.g., phenyl) or alkyl/aryl silsesquioxanes, and copolymers of silsesquioxanes (e.g., copolymers of polyimides and silsesquioxanes).

The cyclic siloxane or other silicon based dielectric precursor may be delivered to the vicinity of a semiconductor wafer where a silicon containing porogen is also delivered. As described above, this may be accomplished through conventional CVD or other deposition methods. In this manner, the silicon based dielectric precursor and the silicon containing porogen combine to form the porogen material noted above.

The organic silicon containing porogens of the porogen material may include a thermally cleavable organic group. In one embodiment, the porogen material is activated by exposure to ultraviolet radiation to release a cleavable organic group. Such silicon containing porogens may include carboxylates with alkyl, fluoroalkyl, perfluoroalkyl, cycloalkyl, aryl, fluoroaryl, vinyl, allyl, or other side chains. In other embodiments, silicon-containing porogens may include an ultraviolet radiation cleavable side chain that is a tertiary alkyl group, such as a t-butyl or amyl group. The particular silicon containing porogen employed is a matter of design choice depending on factors such as compatibility with the silicon based dielectric precursor, the size and amount of pores to be formed, and the desired parameters to be employed in activating the porogenesis.

Still further, the silicon based dielectric precursor may include tetramethylcyclotetrasiloxane, hexamethylcyclotetrasiloxane, octamethylcyclotetrasiloxane, for example.

One class of matrix precursors include thermosettable benzocyclobutenes (BCBs) or b-staged products thereof. For example, 1,3-bis(2-bicyclo[4.2.0]octa-1,3,5-trien-3-ylethynyl)-1,1,3,3-tetramethyldisiloxane (referred to as DVS-bis-BCB) is a suitable, the b-staged resin of which is commercially available as CYCLOTENE® resin (from The Dow Chemical Company).

Another class of matrix materials include polyarylenes. Polyarylene, as used herein, includes compounds that have backbones made from repeating arylene units and compounds that have arylene units together with other linking units in the backbone, e.g. oxygen in a polyarylene ether. Examples of commercially available polyarylene compositions include SiLK® Semiconductor Dielectric (from The Dow Chemical Company), Flare® dielectric (from Allied Signal, Inc.), and Velox® (poly(arylene ether)) (from Air-Products/Shumacher). One class of polyarylene matrix precursors are thermosettable mixtures or b-staged products of a polycyclopentadienone and a polyacetylene. Examples of the thermosetting compositions or cross-linkable polyarylenes that may be used include monomers such as aromatic compounds substituted with ethynylic groups ortho to one another on the aromatic ring; cyclopentadienone functional compounds combined with aromatic acetylene compounds; and polyarylene ethers. More preferably, the thermosetting compositions comprise the partially polymerized reaction products (i.e., b-staged oligomers) of the monomers mentioned above.

When the matrix precursor comprises a thermosettable mixture or b-staged product of a polycyclopentadienone and a polyacetylene, the precursors preferably are characterized so that branching occurs relatively early during the curing process. Formation of a branched matrix early on in the cure process minimizes the modulus drop of the matrix, and helps minimize possible pore collapse during the cure process. One approach for achieving this is to use a ratio of cyclopentadienone functionality to acetylene functionality in the precursor composition of greater than about 3:4, and preferably less than about 2:1, more preferably about 1:1. A matrix precursor comprised of 3 parts 3,3'-(oxydi-1,4-phenylene)bis(2,4,5-triphenycycipentadienone) and 2 parts 1,3,5-tris(phenylethynyl)benzene (molar ratios) is an example of such a system. Alternatively, additional reagents capable of cross-linking the thermosettable mixture or b-staged product of a polycyclopentadienone and a polyacetylene can be added to minimize the modulus drop of the matrix during the cure process. Examples of suitable reagents include bisorthodiacetylenes; monoorthodiacetylenes; bistriazenes; tetrazines, such as 1,3-diphenyltetrazine; bisazides, such as bissulfonylazides; and peroxides, including diperoxides.

A third example of a matrix precursor suitable for the preparation of the porous matrix is a thermosettable perfluoroethylene monomer (having a functionality of 3 or more) or a b-staged product thereof, e.g., 1,1,1-tris(4-trifluorovinyloxyphenyl)ethane. The thermosettable perfluoroethylene monomer may also be conveniently copolymerized with a perfluoroethylene monomer having a functionality of two. Another suitable polyarylene matrix precursor is a thermosettable bis-o-diacetylene or b-staged product thereof.

During integrated circuit fabrication, the low k dielectric material containing the porogen material is deposited onto a suitable substrate and exposed to the ultraviolet radiation process, e.g., before or after metal interconnect formation as previously described. Suitable substrates include, but are not intended to be limited to, silicon, silicon-on-insulator, silicon germanium, silicon dioxide, glass, silicon nitride, ceramics, aluminum, copper, gallium arsenide, plastics, such as polycarbonate, circuit boards, such as FR-4 and polyimide, hybrid circuit substrates, such as aluminum nitride-alumina, and the like. Such substrates may further include thin films deposited thereon, such films including, but not intended to be limited to, metal nitrides, metal carbides, metal silicides, metal oxides, and mixtures thereof. In a multilayer integrated circuit device, an underlying layer of insulated, planarized circuit lines can also function as a substrate. However, the choice of substrates and devices is limited only by the need for thermal and chemical stability of the substrate at the temperature and pressure.

Figure 1:
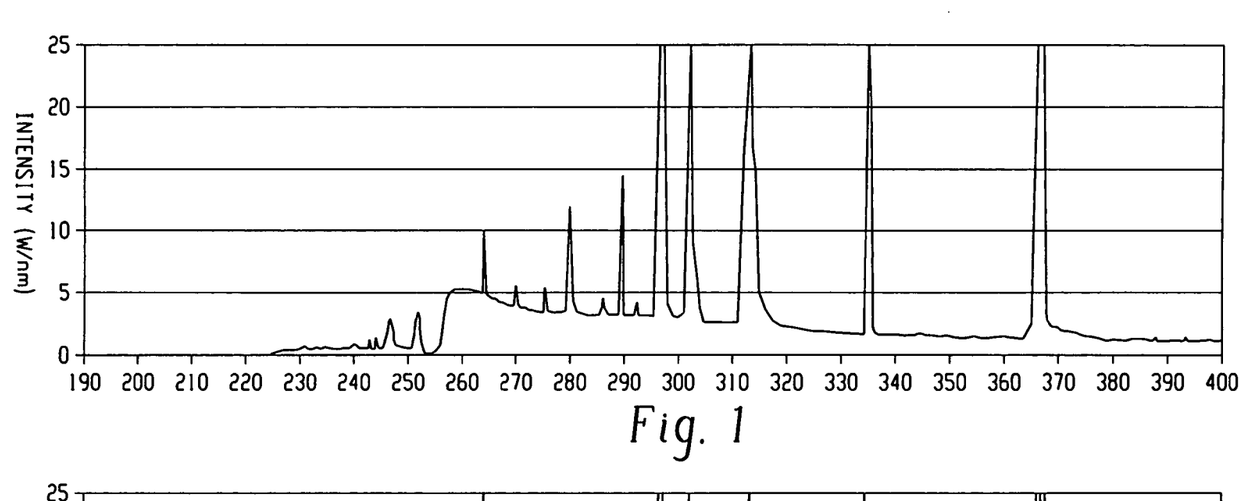
FIG. 1 graphically illustrates a broadband spectral output of a Type I electrodeless microwave driven bulb.
Figure 2:
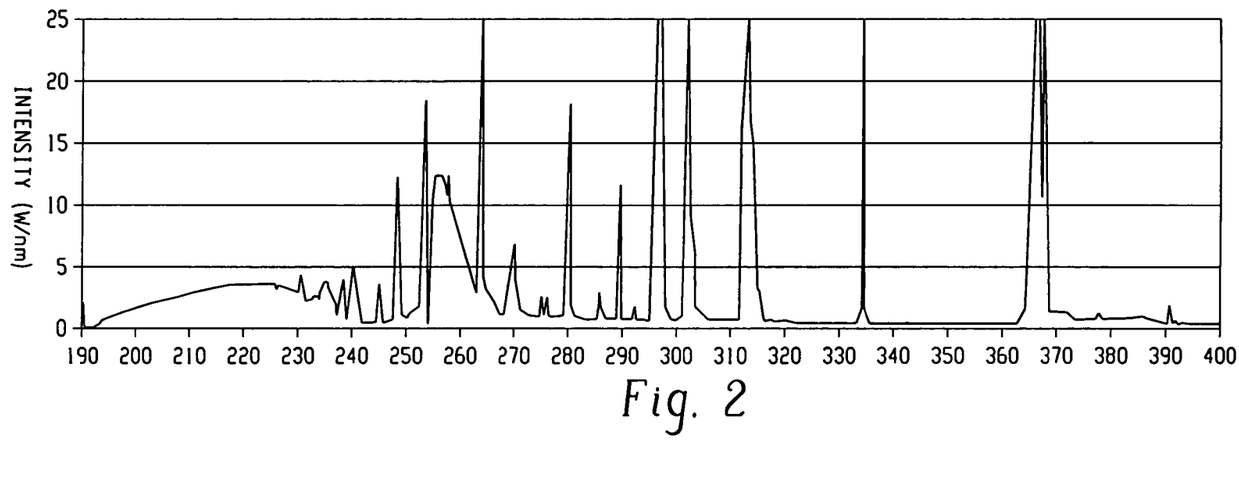
FIG. 2 graphically illustrate the broadband spectral output of a Type II electrodeless microwave driven bulb.

The low k dielectric material containing the porogen material can be processed in a UV irradiator tool or the like in which the atmosphere is preferably first purged with nitrogen, helium, or argon to allow the UV radiation to enter the process chamber, if applicable, with minimal spectral absorption and to generate an inert environment around the low-k dielectric structure to prevent oxidization. For example, the dielectric material can be positioned within the process chamber, which is purged separately and process gases, such as $N_2$, $H_2$, Ar, He, Ne, $H_2O$ vapor, COZ, $O_2$, $C_xH_y$, $C_xF_y$, $C_xH_zF_y$, and mixtures thereof, wherein x is an integer between 1 and 6, y is an integer between 4 and 14, and z is an integer between 1 and 3, may be utilized for different applications. In this regard, UV curing and/or porogen removal can occur at vacuum conditions, or at conditions without the presence of oxygen, or with oxidizing gases. The UV light source can be microwave driven, arc discharge, dielectric barrier discharge, or electron impact generated. Moreover, UV generating bulbs with different spectral distributions may be selected depending on the application such as, for example, microwave electrodeless bulbs identified as Type I, or Type II and available from Axcelis Technologies (Beverly, Mass.). Spectra obtained from the Type I and Type II bulbs and suitable for use in the UV cure process are shown in FIGS. 1 and 2, respectively.

The temperature of the substrate may be controlled ranging from room temperature to about 450° C., optionally by an infrared light source, an optical light source, a hot surface, or the light source itself. The process pressure can be less than, greater than, or equal to atmospheric pressure. Typically, the UV treated dielectric material, whether for curing or porogen removal, is UV treated for no more than or about 600 seconds and, more particularly, between about 60 and about 300 seconds. Also, UV treating can be performed at a temperature between about room temperature and about 450° C.; at a process pressure that is less than, greater than, or about equal to atmospheric pressure; at a UV power between about 0.1 and about 2,000 mW/cm$^2$; and a UV wavelength spectrum between about 150 and about 400 nm. Moreover, the UV cured dielectric material can be UV treated with a process gas purge, such as $N_2$, $O_2$, Ar, He, $H_2$, $H_2O$ vapor, $CO_2$, $C_xH_y$, $C_xF_y$, $C_xH_zF_y$, air, and combinations thereof, wherein x is an integer between 1 and 6, y is an integer between 4 and 14, and z is an integer between 1 and 3.

The elastic modulus and/or material hardness of the UV cured dielectric materials are increased as compared to furnace (thermally) cured or uncured dielectric materials. Moreover, the treatment times are significantly less, thereby representing a significant commercial advantage. A furnace cured or uncured advanced low-k material typically has an elastic modulus between about 0.5 gigapascals (Gpa) and about 8 GPa when the dielectric constant is between about 1.6 and about 2.7. Typically, the elastic modulus of the UV cured dielectric material is greater than or about 2.5 GPa, and more typically between about 4 GPa and about 12 GPa. The material hardness of furnace cured or uncured films are about 0.1 GPa. Typically, the material hardness of the UV cured dielectric material is greater than or about 0.25 GPa, and more typically between about 0.25 GPa and about 1.2 GPa.

In order that the disclosure may be more readily understood, reference is made to the following examples, which are intended to illustrate the invention, but not limit the scope thereof.

EXAMPLES

Example 1

Figure 3:
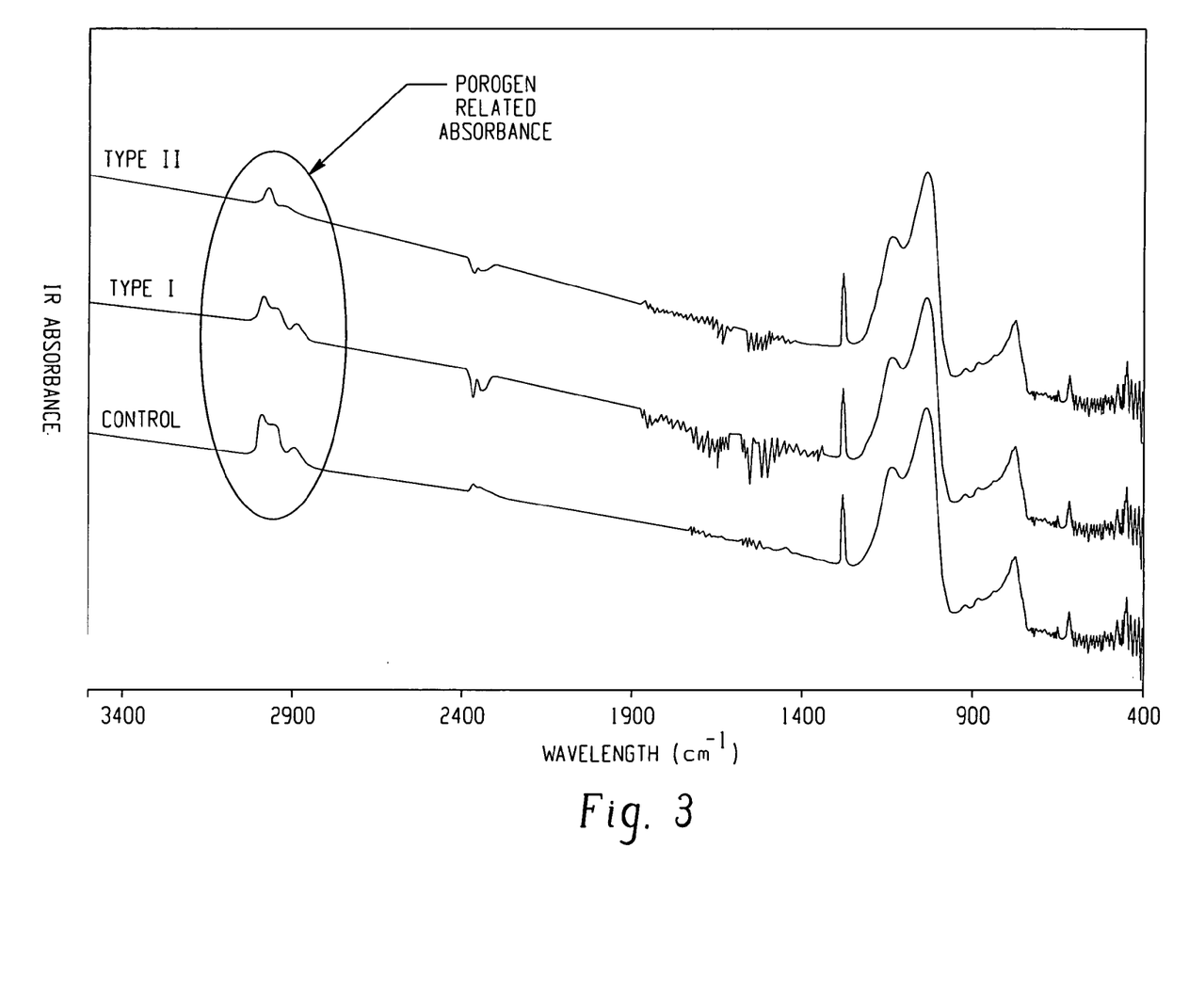
FIG. 3 graphically illustrates an FTIR spectra of a CVD deposited SICOH low k dielectric film containing a porogen material before and after exposure to different ultraviolet radiation patterns.

In this example, silicon substrates that contained a proprietary CVD deposited SiCOH porogen containing films were provided by a manufacturer. The films were exposed to different ultraviolet radiation patterns at 350° C. in a RapidCure Exposure tool available from Axcelis Technologies, Inc. and subjected to FTIR analysis. The ultraviolet radiation pattern was produced with Type I or Type II microwave electrodeless bulbs in an inert atmosphere. A control that did not include exposure to UV radiation was included in the analysis. As shown in FIG. 3, the porogen related absorbance at about 3,000 cm$^{-1}$ clearly illustrates a dependence on wavelength exposure. Exposure to ultraviolet radiation having no substantial radiation at wavelengths less than 240 nm (Type I bulb, spectra shown in FIG. 1) did not exhibit any detectable amounts of porogen removal since the absorbance spectra for exposure to wavelengths greater than 240 nm was clearly similar to the control. In contrast, exposure to broadband ultraviolet radiation at wavelengths less 240 nm (Type II bulb shown in FIG. 2) resulted in substantial removal of the porogen as is evidence by the removal of the shoulder peaks in comparison to the control. Accordingly, more effective porogen removal was observed at exposure wavelengths of about 180-240 nm compared to exposure at wavelengths greater than 240 nm.

Example 2

Figure 4:
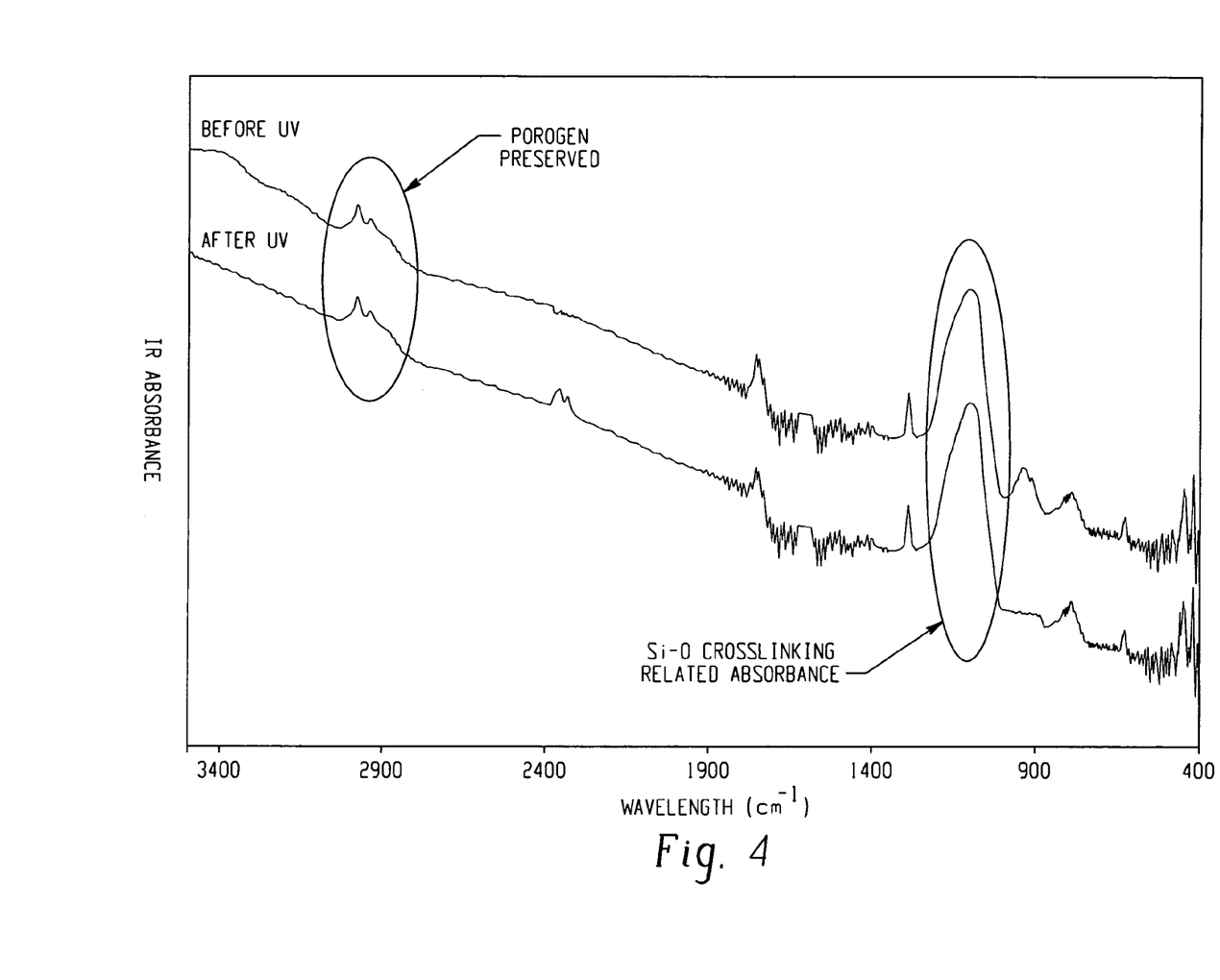
FIG. 4 graphically illustrates an FTIR spectra of a CVD deposited SICOH low k dielectric film containing a porogen material before and after exposure to ultraviolet radiation effective to increase crosslinking density in the low k dielectric film.

In this example, silicon substrates that contained a proprietary CVD deposited SiCOH porogen containing film were provided by a manufacturer. The substrates were processed in accordance with Example 1 using a Type I microwave electrodeless bulb. FIG. 4 illustrates the spectra before and after UV exposure. As is evidenced by the peak absorption at about 950 cm$^{-1}$, exposure to UV radiation caused a broadening in absorption intensity related to Si—O crosslinking, indicating an increase in Si—O crosslinking (primarily caused by a decrease in Si—OH functionality, the peak associated with $S_1$—$CH_3$ absorbance at about 1300 cm$^{-1}$ did not change before or after exposure). Analysis of the intensity pattern related to porogen absorption at about 3000 cm$^{-1}$ showed that the porogen remains in the low k dielectric film after exposure to the ultraviolet radiation.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A process for forming an electrical interconnect structure, the process comprising, in sequence:
    depositing a non-porous dielectric material onto a substrate, wherein the non-porous dielectric material consists essentially of a matrix and a porogen material;
    patterning the non-porous dielectric material and forming a metal interconnect structure; and
    exposing the non-porous low k dielectric material to an ultraviolet radiation pattern for a period of time effective to remove a portion of the porogen material, wherein the removed portion forms pores within the matrix and forms a porous dielectric material, wherein the ultraviolet radiation pattern comprises broadband wavelengths less than 240 nanometers.

2. The process of claim 1, wherein the porous dielectric material has an elastic modulus greater than or equal to about 2.5 GPa.

3. The process of claim 1, wherein the porous dielectric material has material hardness greater than or equal to about 0.25 GPa.

4. The process of claim 1, wherein the porous dielectric material has material hardness between about 0.25 GPa and about 1.2 GPa.

5. The process of claim 1, wherein the porous dielectric material has an elastic modulus is between about 4 GPa and about 12 GPa.

6. The process of claim 1, wherein forming the metal interconnect structure comprises depositing a copper metal.

7. The process of claim 1, wherein the porogen material degrades upon exposure to the ultraviolet radiation to form volatile fragments or radicals.

8. The process of claim 1, wherein exposing the non-porous dielectric material prior to the ultraviolet radiation pattern comprises purging an atmosphere about the non-porous dielectric material with an inert gas.

9. The process of claim 1, further comprising exposing the non-porous dielectric material to a different ultraviolet radiation pattern for a period of time and intensity effective to crosslink the matrix.

10. A process for forming an electrical interconnect structure, the process comprising:
    depositing a non-porous dielectric material comprising a matrix and a porogen material onto a substrate;
    exposing the non-porous dielectric film to a first ultraviolet radiation pattern, wherein the first ultraviolet radiation pattern is effective to increase the crosslinking density of the non-porous dielectric film, and wherein a concentration of the porogen material remains substantially the same before and after exposure to the first ultraviolet radiation pattern;
    patterning the non-porous dielectric material and forming a metal interconnect structure in the patterned non-porous dielectric material; and
    exposing the non-porous dielectric material to a second ultraviolet radiation pattern in an amount to effectively remove porogen material from the matrix and form a porous low k dielectric material.

11. The process of claim 10, wherein the first ultraviolet radiation pattern comprises wavelengths greater than about 240 nanometers; and the second ultraviolet radiation pattern comprises wavelengths that extend below 240 nanometers.

12. The process of claim 10, wherein exposing the low k dielectric material to the second ultraviolet radiation pattern is in an atmosphere of $N_2$, $H_2$, Ar, He, Ne, $H_2O$ vapor, $CO_z$, $O_z$, $C_xH_y$, $C_xF_y$, $C_xH_zF_y$, and mixtures thereof wherein x is an integer between 1 and 6, y is an integer between 4 and 14, and z is an integer between 1 and 3.

13. A process for forming an electrical interconnect structure, the process comprising:
    depositing a non-porous dielectric material onto a substrate, wherein the non-porous dielectric material comprises a porogen material;
    patterning the non-porous dielectric material and forming a metal interconnect structure; and
    exposing the metal interconnect structure to an ultraviolet radiation pattern for a period of time effective to remove the porogen material from the non-porous dielectric material, wherein the removed portion forms air gaps between the metal interconnect structures, wherein the ultraviolet radiation pattern comprises broadband wavelengths less than 240 nanometers.

14. The process of claim 13, wherein exposing the metal interconnect structure to the ultraviolet radiation pattern comprises creating an atmosphere of $N_2$, $H_2$, Ar, He, Ne, $H_2O$ vapor, $CO_z$, $O_z$, $C_xH_y$, $C_xF_y$, $C_xH_zF_y$, and mixtures thereof wherein x is an integer between 1 and 6, y is an integer between 4 and 14, and z is an integer between 1 and 3 about the metal interconnect structure.

15. The process of claim 13, wherein exposing the metal interconnect structure to the ultraviolet radiation pattern is for a time less than 600 seconds.

16. The process of claim 13, further comprising heating the substrate prior to, simultaneously with, or after exposing the metal interconnect structure to the ultraviolet irradiation.

* * * * *

UNITED STATES PATENT AND TRADEMARK OFFICE
CERTIFICATE OF CORRECTION

PATENT NO. : 7,629,272 B2  Page 1 of 1
APPLICATION NO. : 11/146742
DATED : December 8, 2009
INVENTOR(S) : Waldfried et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 753 days.

Signed and Sealed this

Second Day of November, 2010

David J. Kappos
*Director of the United States Patent and Trademark Office*